(12) United States Patent
Uzoh et al.

(10) Patent No.: US 9,634,412 B2
(45) Date of Patent: Apr. 25, 2017

(54) CONNECTOR STRUCTURES AND METHODS

(75) Inventors: Cyprian Uzoh, San Jose, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 176 days.

(21) Appl. No.: 13/183,920

(22) Filed: Jul. 15, 2011

(65) Prior Publication Data

US 2013/0014979 A1 Jan. 17, 2013

(51) Int. Cl.
*H05K 1/09* (2006.01)
*H01R 13/03* (2006.01)
*H05K 3/40* (2006.01)
*H05K 3/28* (2006.01)

(52) U.S. Cl.
CPC ......... *H01R 13/03* (2013.01); *H05K 3/4007* (2013.01); *H05K 1/09* (2013.01); *H05K 3/282* (2013.01); *H05K 2201/0338* (2013.01); *H05K 2201/09745* (2013.01); *Y10T 29/49155* (2015.01)

(58) Field of Classification Search
CPC . H05K 2201/0338; H05K 2201/09745; H05K 3/282; H05K 3/4007; H01R 13/18; H01R 13/20; H01R 13/111; H01R 13/193; H01H 1/01; H01H 1/06; H01H 1/21; H01H 1/23; H01H 1/36

USPC ........ 174/250, 257, 260, 262, 264; 428/614, 428/643–647, 670, 674, 929, 931
See application file for complete search history.

(56) References Cited

U.S. PATENT DOCUMENTS

| | | | | |
|---|---|---|---|---|
| 4,824,390 A | * | 4/1989 | Crane | H01R 13/5216 439/271 |
| 4,864,725 A | * | 9/1989 | Debbaut | 29/871 |
| 5,028,492 A | * | 7/1991 | Guenin | 428/614 |
| 5,326,789 A | * | 7/1994 | Narayanan | 514/788 |
| 5,639,992 A | * | 6/1997 | Debbaut | H01B 17/60 174/84 C |
| 6,463,779 B1 | * | 10/2002 | Terziakin | B21D 37/16 148/567 |
| 6,627,329 B1 | * | 9/2003 | Shintani | 428/624 |
| 6,665,930 B2 | * | 12/2003 | Matuschik | H01R 12/57 174/260 |
| 2005/0175266 A1 | * | 8/2005 | Noack | F16C 17/02 384/277 |
| 2005/0263891 A1 | * | 12/2005 | Lee et al. | 257/751 |
| 2006/0070885 A1 | * | 4/2006 | Uzoh et al. | 205/122 |
| 2007/0015419 A1 | * | 1/2007 | Sweetland | 439/723 |
| 2008/0000678 A1 | * | 1/2008 | Johnston et al. | 174/262 |
| 2009/0081477 A1 | * | 3/2009 | Kobayashi | 428/637 |
| 2009/0098781 A1 | * | 4/2009 | Volka | C10M 107/10 439/886 |
| 2010/0151672 A1 | * | 6/2010 | Choi et al. | 438/627 |

* cited by examiner

*Primary Examiner* — Timothy Thompson
*Assistant Examiner* — Paresh Paghadal
(74) *Attorney, Agent, or Firm* — Haynes and Boone, LLP (57) ABSTRACT

Electrical contacts comprising a surface with a plurality of cavities therein and their methods of manufacture and use.

30 Claims, 4 Drawing Sheets

CONNECTOR STRUCTURES AND METHODS

BACKGROUND OF THE DISCLOSURE

Conductive materials are used in myriad electronics applications as a finish contact surface. Gold, for example without limitation, has been traditionally valued in the electronics industry for its excellent resistance to environmental oxidation, low resistivity, and as a consequence is frequently used in finish contact surfaces. For example, in connector applications, a connector substrate material, such as copper, can be coated with a layer of gold. Depositing gold directly over the substrate, however, is detrimental to the contact resistance of the connector. Copper and gold, for example, undergo solid state inter-diffusion even at room temperature; the copper diffuses through the gold layer causing the gold to tarnish and corrode. Additionally, the electrical resistivity of the resulting alloy material is much higher than the resistivity of either element alone. In practice, a barrier layer, such as, for example without limitation, a layer comprising nickel, is typically deposited over the substrate surface prior to the conductive layer deposition. Some metals, such as gold, are softer than the barrier and substrate layers (e.g., nickel and copper), and as such the barrier layer serves as a backing to the finish contact layer to provide added hardness.

Figures 1, 2:
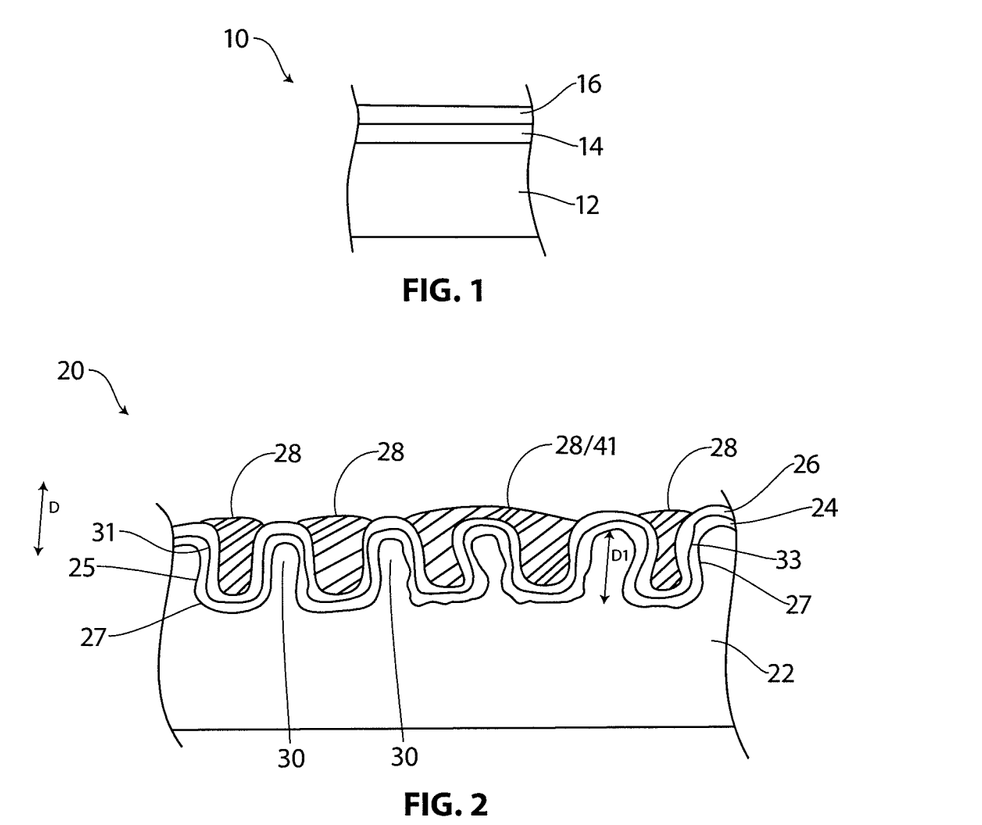
FIG. 1 illustrates an exemplary prior art connector comprising a substrate layer, a barrier layer 14, and a contact surface layer.
FIG. 2 illustrates an exemplary connector structure comprising a plurality of cavities and a lubricating substance.
Figure 14:
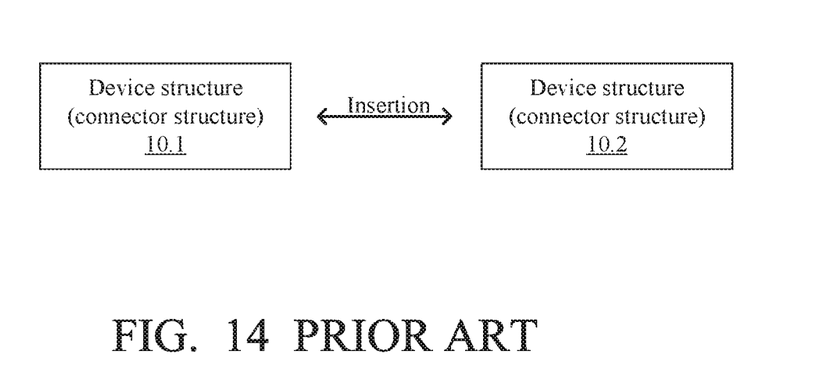
FIG. 14 is a schematic illustration of prior art connector structures insertable one into the other.

In connector applications in which insertion, particularly repeated insertions, is a necessity, contact surface loss or wear due to fretting or galling is problematic because loss of material on the contacting surface results in undesirable higher contact resistance. Traditionally, the thickness of the contact surface is increased as the expected number of insertions increases. For example, connectors requiring few insertions may be coated with about 0.2 to about 0.5 microns of contact surface material, while those requiring larger number of insertions may be coated with about 1.5 microns or more of gold. FIG. 1 illustrates an exemplary prior art connector 10 comprising substrate layer 12, barrier layer 14, and contact surface layer 16. Connector 10 represents any one of connector structures (device structures) 10.1, 10.2 of FIG. 14; one of structures 10.1 and 10.2 is insertable into the other. Some conductive metals, such as gold, price at over $1,200/oz. It would be beneficial to have a lower cost contact structure, one whose contact layer thickness is either independent of the number of expected insertions, or is reduced relative to the thickness in traditional connectors.

SUMMARY OF THE DISCLOSURE

One aspect of the disclosure is an electrical contact comprising a connector substrate layer comprising a surface with a plurality of cavities, at least one of which is irregularly distributed on the surface.

In some embodiments the contact further comprises a barrier layer disposed on the surface. The barrier layer can comprise a plurality of barrier cavities, which can be in alignment with the plurality of cavities. The contact can further comprise a lubricating substance, such as a fluid, disposed within the plurality of barrier cavities. The fluid can be trapped within the plurality of cavities by capillary force. The barrier layer can comprise nickel or a nickel alloy. The barrier layer can comprise a first barrier layer and a second barrier layer adjacent the first barrier layer. The first barrier layer can be a nickel layer and the second barrier layer can be a nickel alloy layer. The contact can also include a conductive layer, such as a gold layer, disposed on the barrier layer. The conductive layer can be between about 0.01 to about 0.4 microns thick. The barrier layer can comprise a plurality of barrier cavities, and the conductive layer comprises a plurality of conductive cavities in alignment with the barrier cavities. A lubricating substance can be within the conductive cavities. The plurality of conductive cavities can be about 0.1 to about 0.2 microns deep. The barrier layer can comprise a plurality of barrier cavities, and wherein the conductive layer fills in the plurality of barrier cavities. The conductive layer can fill in the plurality of barrier cavities and additionally comprises a plurality of protruding elements that protrude away from the plurality of barrier cavities. A lubricating substance can also be disposed within the protruding elements. The protruding elements can each have a height between about 0.05 microns to about 0.2 microns. The barrier layer can comprise a plurality of barrier cavities, the connector further comprising a filler conductive material partially filling the plurality of barrier cavities. The filler conductive material can fill between about 50% and about 80% of each of the plurality of barrier cavities. A conductive layer can be disposed on the filler conductive material and filling in each of the plurality of barrier cavities. The conductive layer can additionally comprise a plurality of protruding elements that protrude away from the plurality of barrier cavities, and optionally a lubricating substance disposed within the protruding elements.

In some embodiments the substrate layer is a copper layer.

In some embodiments the contact further comprises a lubricating substance disposed within the plurality of cavities.

One aspect of the disclosure is an electrical contact comprising a connector substrate layer and a barrier layer comprising a plurality of cavities disposed on the connector substrate layer.

In some embodiments the contact further comprises a lubricating substance disposed within the plurality of cavities.

In some embodiments the connector substrate layer is a copper layer.

In some embodiments the barrier layer comprises nickel or a nickel alloy.

In some embodiments the barrier layer comprises a first barrier layer and a second barrier layer adjacent the first barrier layer. The first barrier layer can be a nickel layer and the second barrier layer can be a nickel alloy layer.

In some embodiments the connector substrate layer and the barrier layer have a planar interface.

In some embodiments each of the plurality of cavities has a depth of about 0.1 microns to about 0.2 microns.

In some embodiments the plurality of cavities are irregularly distributed.

In some embodiments the barrier layer is between about 5 nm and about 700 nm.

One aspect of the disclosure is an electrical contact comprising a connective connector substrate layer, a conductive barrier layer disposed on the connective connector substrate layer, and a conductive layer comprising a plurality of cavities disposed on the conductive barrier layer.

In some embodiments the contact further comprises a lubricating substance disposed in the plurality of cavities.

In some embodiments the connective connector substrate layer is a copper layer.

In some embodiments the conductive barrier layer comprises nickel or a nickel alloy.

In some embodiments the conductive barrier layer comprises a first barrier layer and a second barrier layer adjacent the first barrier layer. The first barrier layer can be a nickel layer and the second barrier layer can be a nickel alloy layer.

In some embodiments the conductive layer is a gold layer.

In some embodiments the plurality of cavities are each about 0.1 microns to about 0.2 microns deep.

In some embodiment the substrate and barrier layers have a planar interface.

In some embodiments the barrier layer and conductive layer have a planar interface.

In some embodiments the plurality of cavities are irregularly distributed.

One aspect of the disclosure is a method of manufacturing an electrical contact, comprising providing a substrate connector layer, and producing a plurality of cavities in a surface of the substrate connector layer.

In some embodiments providing a substrate connector comprises plating a substrate connector.

In some embodiments producing a plurality of cavities comprises spinning the connector. The spinning step can allow oxygen in the air to create the plurality of cavities. The spinning step can comprise spinning for about 30 seconds to about 1 minute.

In some embodiments producing a plurality of cavities comprises exposing the substrate connector layer to a wet etchant.

In some embodiments producing a plurality of cavities comprises exposing the surface to at least one acid.

In some embodiments the method further comprises disposing a barrier layer on the substrate layer. Disposing a barrier layer on the substrate layer can comprise disposing a first barrier layer and a second barrier layer adjacent the first barrier layer. Disposing the first barrier layer can comprise disposing a nickel layer and disposing a second barrier layer can comprise disposing a nickel alloy layer. Disposing a barrier layer on the substrate layer can comprise using a wet deposition method. Disposing a barrier layer on the substrate layer can comprise disposing the barrier layer within the plurality of cavities to create a plurality of barrier cavities. The method can further comprise disposing a lubricating substance, such as a fluid, within the plurality of barrier cavities. The method can further comprise disposing a conductive layer on the barrier layer, which can be about 0.01 to about 0.4 microns thick on the barrier layer. Disposing a conductive layer on the barrier layer can comprise disposing the conductive layer within the plurality of cavities to create a plurality of conductive cavities. A lubricating substance can also be disposed within the plurality of conductive cavities. Disposing a conductive layer on the barrier layer can comprise filling in the plurality of cavities with the conductive layer, such as from a super-filling gold plating bath. A plurality of conductive protruding elements can also be created to protrude from the plurality of barrier cavities. A lubricating substance can be disposed within the plurality of protruding elements. Creating a plurality of conductive protruding elements can comprise creating a plurality of conductive protruding elements with a height of about 0.05 to about 0.2 microns. The method can also include partially filling in the barrier cavities with a filler conductive material. Partially filling in the barrier cavities can comprise filling in about 50% to about 80% of each of the barrier cavities with the filler conductive material. A conductive material different than the filler conductive material can then be filled in the cavity above the filler conductive material. A plurality of conductive protruding elements can then be created with the conductive material protruding away from the plurality of barrier cavities. A lubricating substance can then be filed in within the plurality of protruding elements.

In some embodiments the method further comprises disposing a lubricating substance within the plurality of cavities.

In some embodiments producing a plurality of cavities comprises a first step that produces a plurality of cavities with a first size and a second step that changes the first size to a second size. The first step can produce a plurality of cavities with a first depth, and the second step can change the first depth to a second depth greater than the first depth.

In some embodiments producing a plurality of cavities comprises producing a plurality of cavities width a depth of about 1% to about 20% of a thickness of the substrate connector layer.

In some embodiments producing a plurality of cavities comprises producing a plurality of cavities adapted to trap a lubricating substance within the plurality of cavities. Producing a plurality of cavities adapted to trap a lubricating substance within the plurality of cavities can comprise producing a plurality of cavities adapted to trap a lubricating substance within the plurality of cavities by a capillary force.

In some embodiments producing a plurality of cavities comprises producing at least one cavity with a first width dimension at a first depth and a second width dimension at a second depth, wherein the second depth is greater than the first depth, and wherein the second width dimension is greater than the first width dimension.

In some embodiments producing a plurality of cavities comprises producing a plurality of irregularly distributed cavities.

One aspect of the disclosure is a method of manufacturing an electrical contact, comprising providing a substrate connector layer, disposing a barrier layer on the substrate connector layer, and producing a plurality of cavities in a surface of the barrier layer. The method can further comprise disposing a lubricating substance within the plurality of cavities. Producing a plurality of cavities can comprise producing a plurality of cavities about 0.1 microns to about 0.2 microns deep. Producing a plurality of cavities can comprises producing a plurality of irregularly distributed cavities.

One aspect of the disclosure is a method of manufacturing an electrical contact, comprising providing a substrate connector layer, providing a barrier layer disposed on the substrate connector layer, disposing a conductive layer on the barrier layer, and producing a plurality of cavities in a surface of the conductive layer. Producing a plurality of cavities can comprise etching the conductive layer. Producing a plurality of cavities can comprise producing a plurality of irregularly distributed cavities.

One aspect of the disclosure is an electrical contact comprising a connector substrate layer comprising a surface with a plurality of cavities, a barrier layer disposed on the substrate layer and comprising a plurality of barrier cavities, and a conductive layer disposed on the barrier layer comprising a plurality of conductive cavities. The plurality of cavities on the connector substrate layer can be are irregularly distributed.

One aspect of the disclosure is a method of manufacturing an electrical contact, comprising providing a connector substrate layer, creating a plurality of cavities on a surface of the substrate layer, depositing a barrier layer on the substrate layer to create a plurality of barrier cavities, and depositing a conductive layer on the barrier layer to create a plurality of conductive cavities. Creating a plurality of cavities on a surface of the substrate layer can comprise creating a plurality of irregularly distributed cavities.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

A better understanding of the features and advantages of the present disclosure will be obtained by reference to the following detailed description that sets forth illustrative embodiments, in which the principles of the disclosure are utilized, and the accompanying drawings of which.

DETAILED DESCRIPTION

The disclosure is related to connector structures and their methods of manufacture and use. The connector structures herein include a conductive contact layer with a reduced thickness relative to traditional conductive contact surface layers. Additionally, the thickness of the conductive contact surface can be independent of the number of expected insertions during the use of the connector. The disclosure provides connector structures with reduced manufacturing cost and added reliability. The connector structures include a surface with a plurality of cavities therein.

FIG. 2 illustrates an exemplary embodiment of a connector structure. Connector structure 20 includes connector substrate layer 22, barrier layer 24, conductive layer 26, and lubricating substance 28. Substrate layer 22 includes a plurality of cavities 25 therein (only one is labeled), each defined by a cavity surface 27. The cavities are produced in substrate 22, forming a plurality of raised regions 30 (only two are labeled for clarity) in the substrate between the cavities.

In the embodiment in FIG. 2, all of the cavities in substrate layer 22 do not have the same dimensions. That is, any dimension of one cavity can be different from any dimension of any other cavity in the surface. For example, the cavities can have different depths, as measured in the "D" dimension. The depth of a cavity is the distance between a raised region adjacent a cavity and the lowest point of the cavity. An exemplary depth is shown in FIG. 2 as "D1". The cavities can have different widths, as measured in the "W" dimension, and different lengths, as measured in the "L" dimension (see FIG. 3). In the embodiment in FIG. 2, all of the cavities do not have the same general configuration, or shape, as is determined by the individual cavity surface 28. Some cavities have a more rectangular cross sectional shape, while others have a general "tear-drop" cross sectional shape. Other cavities have varying configurations that cannot be easily described. Some cavities have a width and length that are greater at a greater depth than are the width and length at a shallower depth of the cavity.

Figure 3:
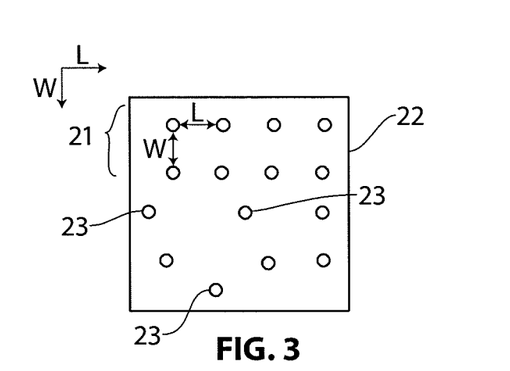
FIG. 3 is a top-view of an exemplary surface comprising a plurality of cavities, at least one of which is irregularly distributed on the surface.

Additionally, the lengths and widths of raised regions 30 (see FIG. 3), that is, the distance between the cavities, is not necessary the same. FIG. 3 illustrates a grossly simplified top view of substrate layer 22 (barrier layer 24 and conductive layer 26 not shown for clarity) in which the at least one cavity is not uniformly oriented with respect to at least two other cavities. For example, the cavities in region 21 can be considered to be in an ordered pattern in the 2×4 orientation shown. The cavities in region 21 can also be considered uniformly disposed, ordered, or patterned. Cavities 23, are not, however, uniformly disposed within substrate layer 22 with respect to the other cavities shown. Cavities 23 are not oriented in the same pattern as those in region 21. In this embodiment three cavities are considered non-ordered, although any number of cavities, including one cavity, can be non-ordered with respect to the other cavities. In some embodiments there is no order, or pattern, to any cavities at all. In any embodiment in which at least one cavity is non-patterned, the orientation of the cavities can be considered to be any of non-uniform, non-ordered, irregular, non-patterned, randomly distributed, irregularly distributed, and any variation or derivative thereof. The non-uniform, or non-ordered cavity orientation can exist within the substrate layer based on the method in which the cavities are formed, examples of which are described in more detail below. The inter-cavity spacing may be less than the opening of average diameter of any two adjacent cavities and the same substrate may include cavities spaced one or more diameters apart. In one embodiment, the inter-cavity spacing is uniform and less than the average diameter of adjacent cavities. In one embodiment, the inter-cavity spacing is uniform and the inter-cavity distance is more than the average diameter of adjacent cavities. In one embodiment, the inter-cavity spacing is non-uniform and the inter-cavity distance is more than the average diameter of adjacent cavities.

In some embodiments the cavity depth is about 5 nm to about 100 nm and generally less than 1 micron. In some embodiments the depth is about 5 nm. In some embodiments the depth is about 10 nm. In some embodiments the depth is about 15 nm. In some embodiments the depth is about 20 nm. In some embodiments the depth is about 25 nm. In some embodiments the depth is about 30 nm. In some embodiments the depth is about 35 nm. In some embodiments the depth is about 40 nm. In some embodiments the depth is about 45 nm. In some embodiments the depth is about 50 nm. In some embodiments the depth is about 55 nm. In some embodiments the depth is about 60 nm. In some embodiments the depth is about 65 nm. In some embodiments the depth is about 70 nm. In some embodiments the depth is about 75 nm. In some embodiments the depth is about 80 nm. In some embodiments the depth is about 85 nm. In some embodiments the depth is about 90 nm. In some embodiments the depth is about 95 nm. In some embodiments the depth is about 100 nm.

The depth of the cavities is in some embodiments generally relatively small compared to the overall depth of the substrate layer. In some embodiments the depth is between about 1% to about 20% of the substrate layer depth. In some embodiments at least some of the cavities are about 5% or less of the total substrate depth. In some embodiments at least some of the cavities are about 4% or less of the substrate depth. In some embodiments at least some of the cavities are about 3% or less of the substrate depth. In some embodiments at least some of the cavities are about 2% or less of the substrate depth. In some embodiments at least some of the cavities are about 1% or less of the substrate depth. In some embodiments at least some of the cavities are an insignificant fraction of the substrate depth, reside in the surface of the substrate, and increase the roughness of the substrate.

In some embodiments all of the cavities do not have the same depth such that they depths vary between at least two cavities. For example, some cavities may have a depth of about 5 nm while others have a depth of about 10 nm, while other cavities have different depths.

The substrate layer, in any of the embodiments herein, can be any suitable substrate layer, such as copper and copper alloys, nickel and nickel alloys, zinc, aluminum, molybdenum, tungsten, cobalt, and any of their respective alloys.

The embodiment of FIG. 2 also includes barrier layer 24 disposed on substrate layer 22. Barrier layer 24 is disposed on the surface of substrate layer 22, including the cavities within substrate 22, such that the barrier layer comprises a plurality of barrier cavities 31 (only one is labeled for clarity) that are in alignment with the cavities within the substrate layer. The barrier cavities are defined by surface 33 of barrier layer 24. Barrier layer 24 similarly includes raised barrier regions (not labeled for clarity) that are aligned with raised regions 30 in substrate layer 22.

The barrier layer can be any suitable barrier layer material. Exemplary barrier layer materials include, without limitation, nickel, nickel alloys (e.g., nickel-tungsten, nickel-phosphorus, and nickel-boron alloys), cobalt alloys, (e.g., cobalt-phosphorus and cobalt-tungsten-phosphorus), other metals or alloys, such as tantalum-nickel, titanium-nickel, molybdenum-tungsten alloys, or other suitable barrier layer materials, metals, and alloys. In some embodiments, binary barrier layers may be used. For example without limitation, the binary barrier layer can be a copper-phosphorus/nickel-phosphorus binary layer, a tantalum-nickel/tantalum binary layer, or a copper-phosphorus/copper-tungsten-phosphorus binary layer.

In an exemplary embodiment the barrier layer is a nickel-boron/nickel/nickel-tungsten barrier layer. The boron and tungsten can be uniformly concentrated within the discrete layer or they can be graded as described below. Such a barrier layer creates a redundant structure and makes it very difficult for barrier layer, and the connector, to fail.

The barrier layers described herein can be an alloy layer, or can have one or more discrete layers that are alloy layers. In some embodiments the barrier layer is a laminated barrier layer with more than one discrete layer (at least one of which is an alloy layer). For example, an exemplary barrier layer can have a first barrier layer (i.e., the bottom barrier layer) and a second barrier layer. In one exemplary embodiment, the first barrier layer is a nickel layer and second barrier layer is a nickel-boron alloy layer. In an exemplary embodiment, the barrier includes a first barrier layer (i.e., the bottom layer), a second layer, and a third layer (i.e., the top layer). In one exemplary embodiment, the first layer is nickel, the second layer is a nickel-boron alloy, and the third layer is nickel, forming a Ni/NiB/Ni laminated barrier layer. Other exemplary barrier layers include a NiB/Ni laminated barrier layer and a NiB/Ni/NiB laminated barrier layer. In some embodiments the alloy layer is about 20 nm to about 200 nm thickness, while the non-alloy layer is about 5 nm to about 50 nm thick. Additional exemplary laminated barrier layers and details of the same that can be incorporated into the barrier layers herein are described in co-pending U.S. patent application Ser. No. 13/183,870, entitled "Electrical Barrier Layers", filed on the same day as the instant application, the complete disclosure of which is incorporated by reference herein.

The composition of the minor component of the alloy material (e.g., boron in a nickel-boron alloy) can additionally vary (or is "graded") throughout the barrier depth (also referred to herein as "thickness") in such a manner to impact desirable tribological properties to the connector structure. For example, the relatively deeper portions of the barrier layer in contact with the substrate layer can be modified to enhance adhesion and barrier properties, while the shallower portion of the barrier layer adjacent to a contact layer (e.g., gold) may be optimized for excellent wetting and excellent tribological properties with the contact layer.

In an exemplary embodiment of a graded alloy layer, the barrier layer is a nickel-boron alloy where nickel is the major constituent and boron in the minor constituent (i.e., nickel is present in a greater percentage than boron). The boron is graded throughout the thickness of the layer such that the boron concentration varies throughout the thickness. In some embodiments the concentration increases towards the top surface, and in some embodiments the concentration decreases towards the top surface. The variation in concentration can be linear or non-linear, and the change in concentration need not extend throughout the entire thickness of the layer. Other suitable minor constituents that can be used include, for example without limitation, carbon, phosphorus, and tungsten. For example, in some embodiments the barrier can be a nickel-tungsten/nickel/nickel-tungsten barrier layer, with the nickel-tungsten layers being graded.

Additionally, in some embodiments, the barrier layer can have two or more alloy layers, wherein the alloy layers have different minor constituents. For example, in some embodiments the barrier layer is a nickel-boron/nickel/nickel-tungsten barrier layer.

In embodiments in which at least one barrier layer is graded, the change in percent of the minor constituent from a first location in the layer to a second location in the layer can be from about 0 to about 49%. In some embodiments the grade is from about 0% to about 10%. In some embodiments it is from about 0% to about 9%, from about 0% to about 8%, from about 0% to about 7%, from about 0% to about 6%, from about 0% to about 5%, from about 0% to about 4%, from about 0% to about 3%, from about 0% to about 2%, or from about 0% to about 1%. These exemplary changes in percentage are not intended to be limiting and other percentages can be used. For example, a boron concentration could vary from about 10% to about 30% throughout a thickness of the layer.

In alternative embodiments in which there are more than one alloy layer in the barrier layer, one of the layers can be have a uniform concentration of a minor constituent while a second layer has a varying concentration the same or a different minor constituent.

Additional exemplary graded barrier layers and details of the same can be found in co-pending U.S. patent application Ser. No. 13/183,870, entitled "Electrical Barrier Layers," filed on the same day as the instant application, the entire disclosure of which is incorporated by reference herein.

In some embodiments the barrier material has microstructure with grain sizes in the range of about 2 nm to about 150 nm, and in some embodiments is between about 5 nm to about 100 nm, and in some embodiments less than 30 nm.

In some embodiments the thickness of the barrier layer is between about 5 nm to about 700 nm depending on the application. In some embodiments in which the barrier layer is an alloy barrier layers, the thickness is between about 10 nm to about 300 nm.

In the embodiment in FIG. 2 connector structure 20 also includes conductive layer 26 disposed on barrier layer 24. Conductive layer 26 is disposed on barrier layer 22, including the cavities formed by barrier layer 22, such that conductive layer 26 comprises a plurality of conductive cavities in alignment with the barrier cavities.

In some embodiments the thickness of conductive layer 26 is between about 0.01 to about 0.4 microns, which is thinner than traditional conductive layer thicknesses. In some embodiments the grain size of the conductive layer is between about 2 nm to about 100 nm. The connector structure embodiment in FIG. 2 allows for a thinner conductive layer compared to traditional conductive layer thickness, but provides more conductive layer surface area due to the added surface area of the cavity surfaces. The cavities also provide enhanced friction with devices that may be inserted into the connector, while still allowing for a thinner conductive layer to be incorporated into the connector structure.

In some embodiments the conductive layer is gold or a gold alloy. In other embodiments the conductive layer is any other suitable conductive material, such as, for example without limitation, silver, platinum, rhodium, palladium, molybdenum, tungsten, or an alloy such as a nickel alloy or a copper alloy, depending on the application of the connector structure.

In the embodiment in FIG. 2, conductive layer 26 includes cavities adapted to receive a substance therein. Connector structure 20 also includes lubricating substance 28 disposed within the cavities in conductive layer 26. The lubricating substance provides boundary lubrication for any device that may be inserted into the connector, particularly when a device is expected to be repeatedly inserted. The lubricating substance preferably does not impede the flow of electric current or significantly increase the contact resistance of the connector structure.

The cavities in the connector structure can be adapted to trap the lubricating substance therein. In some embodiments the lubricating substance is a fluid and is trapped within the cavities by capillary force. The dimensions of the cavity (e.g., width, length, depth) can be such that fluid can be trapped within the cavities by capillary force. Some adjacent cavities may be formed such that a single volume of fluid 28/41 fills adjacent cavities, due to capillary forces. The larger contact surface area of the conductive layer also provides very low and reliable ohmic contact resistance. In the embodiment in FIG. 2, the lubricating substance is a fluid and is trapped within the cavities in conductive layer 56 by capillary forces.

The lubricating substance can be any suitable lubricating substance. For example, the substance can be a fluid (e.g., a liquid) or a solid (e.g., powder). Exemplary lubricating substances include, without limitation, a grease (e.g., a dielectric grease), a gel, a polymeric material (e.g., a silicon-based polymer), and any other suitable lubricating substances. The lubricating substance can include or not include highly conducting nano particulates, such as silver, carbon, etc. It is preferable that any particles used in the lubricant do not significantly degrade or damage the connector material during any repeated insertions.

One aspect of the disclosure is a method of manufacturing an electrical contact, and includes producing a plurality of cavities in a surface of a substrate connector layer. FIGS. 4-7 illustrate an exemplary process of producing connector structure 20 in the embodiment in FIG. 2.

Figure 4:
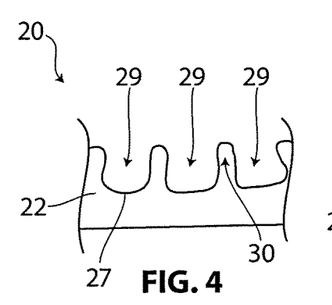
FIGS. 4-7 illustrate an exemplary process of making the exemplary connector shown in FIG. 2.

In a first step, as shown in FIG. 4, a plurality of cavities 29 are created, or produced, within a first surface of substrate connector layer 22, which can be plated prior to the cavities being created. In some embodiments the cavities are produced in a copper plated substrate. In some embodiments a copper substrate is plated in an acid copper bath with about 2% to about 35% mineral acid or organic acid by volume. In some embodiments a plating bath with between about 5 to about 25% sulfuric acid is used. After the plating, the substrate with its drag out solution is spun dry in air or oxygen rich ambient conditions prior to substrate rinsing and drying. The interaction of oxygen and the wet acid on the plated copper surface etches cavities or pits in the plated substrate and roughens the ordinarily expected smooth surface of the plated metal. The lower the acid concentration, the shallower the depth of the cavity, while the higher the concentration of the acid in the bath, the deeper and rougher the surface of the substrate. In this manner the depth of the cavities can be controlled. In some embodiments, multiple sequences of dipping and spin drying may be performed depending on the judicious selection of acid.

In some embodiments, a cleaned substrate without cavities may be dipped in acid solution with or without copper and chloride ions for about, for example, 5 to 60 seconds. Then, prior to rinsing and drying, the substrate is then spun in oxygen rich ambient conditions for about 5 to about 90 seconds, in some embodiments between about 15 and about 45 seconds, at between about 10 and about 5000 rpm, and in some embodiments between about 60 to about 600 rpm. In some embodiments, after dipping the substrate in the acidic solution, the substrate may be spun at lower revolutions-per-minute, such as, for example, about 30 rpm for about 15 seconds, and then the rpm's may be increased stepwise or non-stepwise to much higher rpm's such as, without limitation, about 600 rpm for about 15 seconds. The substrate can then be rinsed and dried. Additionally, multi-step spin drying operations may be used.

In some embodiments the cavities can be produced by exposing the substrate to one or more acidic substances, such as, for example without limitation, phosphoric acid. In some embodiments cavities are created by exposing the substrate to about 5% to about 15% phosphoric or acetic acid, or even sulfonic acid.

In some embodiments the cavities are created by exposing the substrate to a wet etchant to dissolve material on the surface of the substrate. Exemplary wet etchants include, without limitation, sulfuric acid/hydrogen peroxide solutions. In some embodiments the formulation to create the cavities comprises about 2% to about 10% sulfuric acid and about 0.5% to about 5% hydrogen peroxide. Hydrochloric acid solutions with and without peroxide and nitric acid solutions with and without peroxides can be used in some embodiments to make the cavities. Combinations of organic acid or acids with peroxide may be used to create cavities in a copper substrate. Cavities created with organic acids tend to be shallower. It may be beneficial to use mineral acids in some embodiments to reduce costs associated with producing the cavities. Other etchants such as ferric chloride, cupric chloride, and ammonium persulfate may also be used. In some embodiments small amounts of surfactants may be added to improve uniformity of etching and cavity creation. For example, polyethylene glycol (molecular weight about 200 to about 20,000) between about 10 and about 200 parts per million ("ppm"), and sometimes between about 50 and about 2000 ppm can be used. In some embodiments, small amount of glycerol or glycine may be added to the bath to moderate the etch rate of the etchant.

In some embodiments, the cavities may be initiated by electro-etching in a suitable mineral acid prior to substrate spinning, rinsing, and drying. The cavities may be created by electro-etching the substrate in a suitable electrolyte. For example, a copper substrate may be electro-etched in an electrolyte including about 5 to about 50% sulfuric acid in current densities between about 3 to about 60 mA/cm$^2$ for about 0.5 to about 30 seconds. The etched substrate surface is then spun dried in oxygen ambient conditions or in air prior to rinsing and drying. In some embodiments the cavity producing step is carried out more than one time to change a dimension, shape, configuration, or relative orientation of one or more cavities. For example, a first spinning step can be carried out to create a plurality of cavities. Then a second spinning step can be carried to modify a dimension, such as a width, of one or more cavities. A mask could also be used to cover certain cavities while allowing the second step to further modify a select portion of the first cavities.

Figure 5:
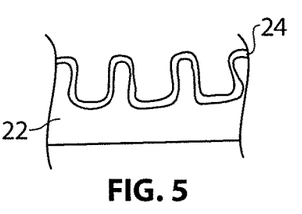

After the cavities are created in the substrate, a barrier layer is disposed over the surface of substrate, as shown in FIG. 5, creating a plurality of barrier cavities. FIG. 5 illustrates the barrier layer 24 disposed on substrate 22. The barrier layer can be formed by coating the barrier material on the substrate layer. In exemplary embodiments the barrier layer is coated on the substrate by wet deposition.

Figure 6:
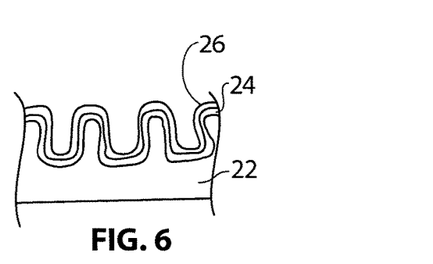

As shown in FIG. 6, conductive layer 26 is then coated on barrier layer 24, forming the conductive layer cavities. In some embodiments the conductive layer is coated on the barrier layer using electrodeposition methods or electroless deposition methods.

Figure 7:
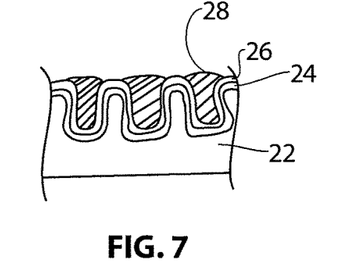

After conductive layer 26 is coated, lubricating substance 28 is then applied or introduced into the cavities, as shown in FIG. 7.

Figure 8:
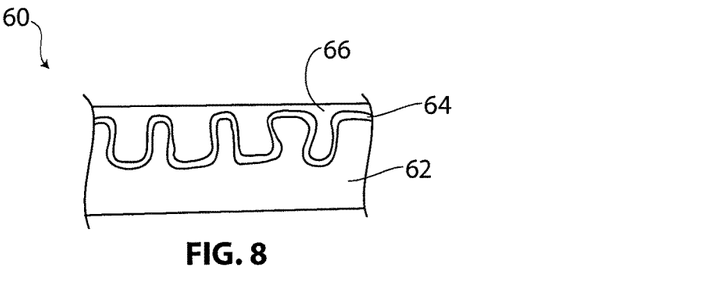
FIG. 8 illustrates an exemplary connector wherein a barrier layer comprises a plurality of cavities and wherein a conductive layer fills in the barrier cavities.

FIG. 8 illustrates an alternative embodiment of a connector structure. Connector structure 60 includes substrate 62, barrier layer 64, and conductive contact layer 66. In this embodiment, the conductive contact layer completely fills in the cavities in barrier layer 64. In this embodiment a lubricating fluid is not shown in any cavities. The substrate and barrier layers can be similar or the same as the substrate and barrier layers in the embodiment in FIG. 2. Substrate 62 and barrier layer 64 can be formed as described above, while conductive layer is coated on the barrier layer to completely fill in the barrier layer cavities.

Figure 9:
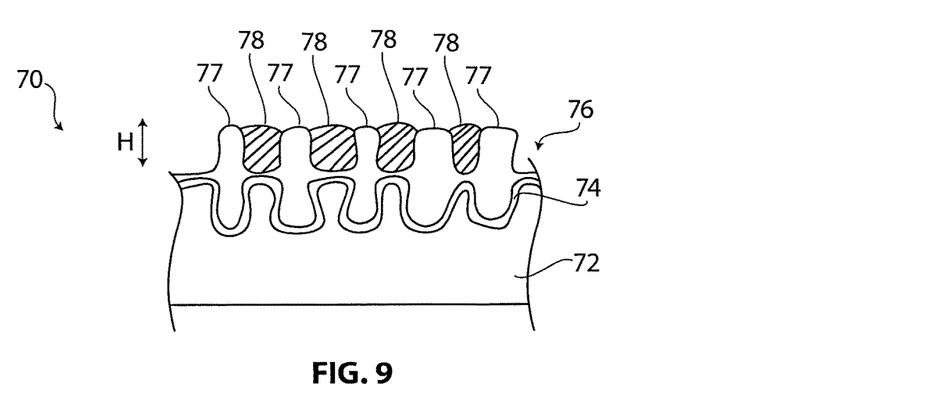
FIG. 9 illustrates an exemplary connector in which a conductive layer is overfilled with respect to barrier cavities, creating conductive layer cavities.

FIG. 9 illustrates an alternative embodiment of a connector structure. Connector structure 70 includes substrate 72, barrier 74, conductive layer 76 and lubricating substance 78. Conductive layer 76 not only completely fills in cavities in barrier layer 74, but also includes protruding elements 77 that extend or protrude away from the barrier layer. Protruding elements 77 form cavities there between, defined by the surface of the protruding elements 77. Lubricating substance 78, such as any of the lubricating substances described herein, is disposed within the cavities in conductive layer 76. In some embodiments protruding elements 77 have a height, measured in the "H" direction (which is the same direction as the depth dimension), of between about 0.05 microns to about 0.2 microns. The cavities in conductive layer can, similar to the cavities in the substrate in the embodiment in FIG. 2, have irregular and varying shapes, and have non-uniform shapes and non-uniform configurations. While the conductive layer 76 in FIG. 5 includes protruding elements 77, the overall conductive layer 76 thickness is still relatively thin compared to traditional conductive layers, and thus still effectively reduces the overall cost of the overall connector structure.

In some embodiments conductive layer 76 with protruding elements 77 is deposited from a super-filling plating bath to overfill the cavities in the barrier layer. A lubrication substance, as described herein, is then introduced into the conductive layer cavities. In some embodiments, for deeper cavities, to further reduce the gold content or cost of the protruding conductor 77, after the barrier layer 74 deposition, the substrate cavities are partially super-filled with lower cost filler conductive material (not shown) such as nickel or nickel alloys prior to overfilling with a more expensive or/and more noble metal, such as gold or gold alloys. The lower cost conductor may fill more than 50% of the cavities and preferably less than 80% of the volume of the cavities, and the protruding conductor fills the remaining gap with the cavities and beyond. The properties of the conductive filler metal should be such that the filler material by its nature does not degrade the desirable properties, such as resistivity, corrosion resistance, and tribological properties, of the metal coated over it.

Figure 10:
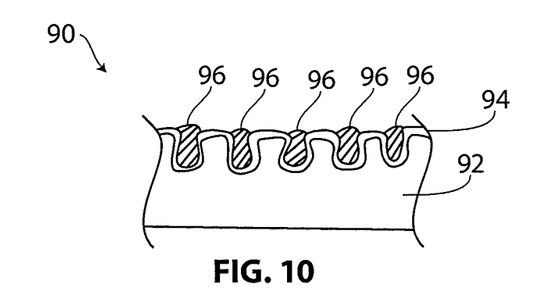
FIG. 10 illustrates an exemplary connector in which barrier cavities are filled with a lubricating substance.

FIG. 10 illustrates an alternative embodiment of a connector structure. Connector structure 90 includes substrate 92, barrier 94, and lubricating substance 96. Connector 90 is similar to connector structures above, but connector structure 90 does not have a dedicated third conductive layer. The good conducting barrier layer of this embodiment processes excellent tribological properties and the lubricating substance 96 trapped in the cavities of the substrate 92 serves to dramatically reduce insertion forces during the various multiple insertion operations.

In this embodiment, the substrate and barrier layers can be formed as described above with respect to FIGS. 4 and 5. After coating the substrate with the barrier layer, however, lubricating substance 96 (which can be any of the substances described herein) is introduced into the barrier cavities and maintained therein as set forth above.

Figure 11:
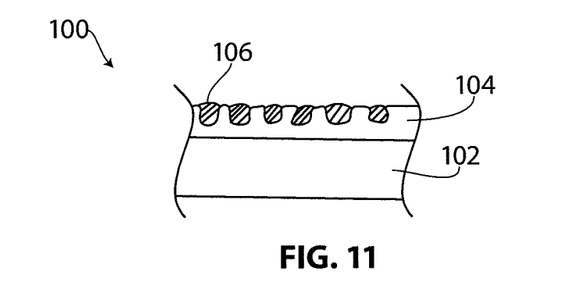
FIG. 11 illustrates an exemplary connector in which a lubricating substance fills barrier cavities.

FIG. 11 illustrates an alternate embodiment of a connector structure. Connector structure 100 includes substrate 102, barrier layer 104, and lubricating substance 106. In this embodiment cavities are not formed within the substrate layer, and as such the interface between substrate 102 and barrier 104 is planar, unlike the interface between the substrate and the barrier in the embodiment in FIG. 2. In this embodiment the plurality of cavities are formed in a surface of barrier layer 104, as shown in FIG. 11.

The cavities in the barrier can be created by, for example, without limitation, wet methods, dry methods, or lithographic methods. In some embodiments the cavities in the barrier layer are formed by exposing the barrier layer to a wet etchant. The cavities can also be created by any of processes described above to create the cavities in a substrate layer. For example, the cavities can be created by spinning the barrier layer in air, allowing oxygen to create the cavities. After the cavities are created in the barrier layer, lubricating substance 106 is disposed within the cavities.

Figure 12:
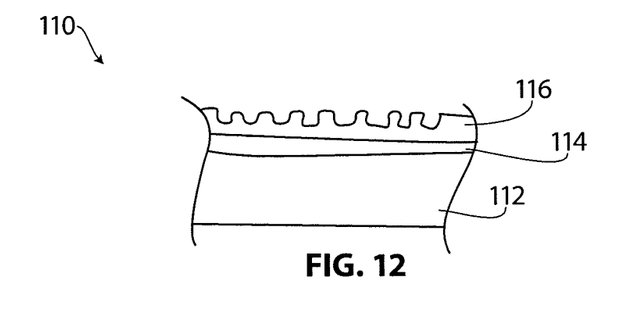
FIG. 12 illustrates an exemplary connector in which cavities have been formed only in a conductive layer.

FIG. 12 illustrates an embodiment in which the cavities are only created in conductive layer 116. Substrate 112 and barrier layer 114 have a planar interface, as do barrier 114 and conductive layer 116. The cavities are created on a surface of conductive layer 116, and can be created by wet or dry methods, such as those described herein, or any other method described herein. For example, the cavities can be created by exposing to a wet etchant, or by spinning the connector structure in air, allowing the oxygen to create the cavities. A suitable lubricating substance (not shown) is then disposed within the conductive layer cavities.

Figure 13:
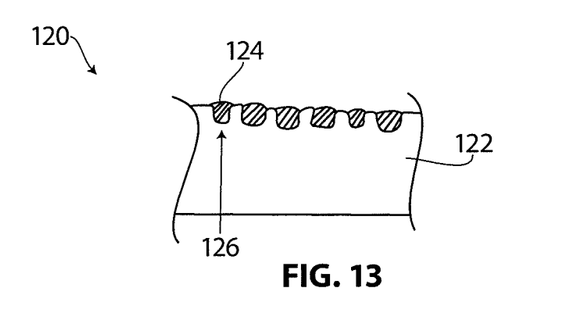
FIG. 13 illustrates an exemplary connector in which a lubricating substance is filled in the cavities of a substrate layer.

FIG. 13 illustrates an alternate embodiment of a connector structure. Connector structure 120 includes substrate 122 and lubricating fluid 124 disposed within cavities 126. Substrate 122 can be formed as is substrate 22 in FIG. 4. Connector structure 120 does not include a barrier layer or conductive layer, but rather than cavities are formed within a surface of substrate. After the cavities are produced, the lubricating substance can then be disposed within the cavities. FIG. 13 illustrates an exemplary embodiment that could be intended for use as a disposable connector structure, but need not be. The lubricating substance 124 within the connector grooves or cavities reduces the insertion force during the multiple insertion operations, it also provides corrosion protection to the connector substrate.

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure herein may be employed in practicing the subject matter of the disclosure.

What is claimed is:

1. An apparatus comprising:
an electrical connector for providing electrical contact with a corresponding device when the device is inserted into the connector, the device being repeatedly insertable into the connector, the connector comprising:
an electrically conductive boundary surface comprising a plurality of first cavities which provide enhanced friction with the device, wherein a particular location of any one of the first cavities does not affect the connector's functionality in providing the electrical contact with the device;
a lubricating substance movable on the boundary surface, for providing boundary lubrication for the device, wherein at least a portion of the lubricating substance is disposed within the first cavities;
a connector substrate layer comprising a surface with a plurality of second cavities;
an electrically conductive barrier layer disposed on the surface of the connector substrate layer, the barrier layer comprising a plurality of barrier cavities, the plurality of barrier cavities being in alignment with the plurality of second cavities, the boundary surface being a surface of the barrier layer, the first cavities being the barrier cavities;
wherein the lubricating substance is a fluid;
wherein at least a portion of the fluid is trapped within the plurality of first cavities by capillary force; and
wherein at least one first cavity has a greater width dimension at a first depth than at a second depth shallower than the first depth and is filled with the lubricating substance.

2. The apparatus of claim 1 wherein the barrier layer comprises nickel or a nickel alloy.

3. The apparatus of claim 1 wherein the barrier layer comprises a first barrier layer and a second barrier layer adjacent the first barrier layer.

4. The apparatus of claim 3 wherein the first barrier layer is a nickel layer and the second barrier layer is a nickel alloy layer.

5. The apparatus of claim 1 wherein the plurality of first cavities are about 0.1 to about 0.2 microns deep.

6. The apparatus of claim 1 wherein the substrate layer is a copper layer.

7. The apparatus of claim 1 wherein at least one first cavity has a greater width dimension at a first depth than at a second depth shallower than the first depth and has a center portion filled with the lubricating substance.

8. The apparatus of claim 1 wherein at least one second cavity has a greater width dimension at a first depth than at a second depth shallower than the first depth, and the first cavity in alignment with the second cavity has a center portion filled with the lubricating substance.

9. The apparatus of claim 1 wherein at least one second cavity has a greater width dimension at a first depth than at a second depth shallower than the first depth, and the first cavity in alignment with the second cavity is filled with the lubricating substance.

10. An apparatus comprising:
an electrical connector comprising an electrically conductive contact surface and configured for insertion operations each of which results in electrical connection with a corresponding device through the contact surface and a lubricating substance on the contact surface, the lubricating substance providing boundary lubrication for the device:
the electrically conductive contact surface comprising a plurality of first cavities which provide enhanced friction with the device, wherein a particular location of any one of the first cavities does not affect the connector's functionality in providing the electrical contact with the device;
wherein at least a portion of the lubricating substance is disposed within the first cavities by capillary force; and
wherein at least one first cavity has a greater width dimension at a first depth than at a second depth shallower than the first depth and is filled with the lubricating substance.

11. The apparatus of claim 10, wherein the electrical connector further comprises:
a connector substrate layer comprising a surface with a plurality of second cavities;
an electrically conductive barrier layer disposed on the surface of the connector substrate layer, the barrier layer comprising a plurality of barrier cavities, the plurality of barrier cavities being in alignment with the plurality of second cavities, the contact surface being a surface of the barrier layer, the first cavities being the barrier cavities.

12. The apparatus of claim 11, wherein the barrier layer comprises nickel or a nickel alloy.

13. The apparatus of claim 11, wherein the barrier layer comprises a first barrier layer and a second barrier layer adjacent the first barrier layer.

14. The apparatus of claim 13, wherein the first barrier layer is a nickel layer and the second barrier layer is a nickel alloy layer.

15. The apparatus of claim 11, wherein the substrate layer is a copper layer.

16. The apparatus of claim 1 wherein the entire boundary surface is a first metal.

17. The apparatus of claim 10 wherein the entire contact surface is a first metal.

18. The apparatus of claim 1 wherein the lubricating substance is operable to reduce wear of the boundary surface in repeated insertions of the device.

19. The apparatus of claim 10 wherein the lubricating substance is operable to reduce wear of the contact surface in repeated insertions of the device.

20. The apparatus of claim 10 wherein at least one first cavity has a greater width dimension at a first depth than at a second depth shallower than the first depth and has a center portion filled with the lubricating substance.

21. The apparatus of claim 11 wherein at least one second cavity has a greater width dimension at a first depth than at a second depth shallower than the first depth, and the first cavity in alignment with the second cavity has a center portion filled with the lubricating substance.

22. The apparatus of claim 11 wherein at least one second cavity has a greater width dimension at a first depth than at a second depth shallower than the first depth, and the first cavity in alignment with the second cavity is filled with the lubricating substance.

23. An apparatus comprising:
an electrical connector comprising an electrically conductive contact surface and configured for insertion operations each of which results in electrical connection with a corresponding device through the contact surface and a lubricating substance located on the contact surface and movable on the contact surface, the lubricating substance providing boundary lubrication for the device;
the electrically conductive contact surface comprising a plurality of first cavities for trapping at least a portion of the lubricating substance, the plurality of first cavities comprising a set of one or more cavities each of which has a greater width dimension at a first depth than at a second depth shallower than the first depth and each of which has a center portion filled with the lubricating substance.

24. The apparatus of claim 23 wherein the lubricating substance is operable to reduce wear of the contact surface in said insertion operations.

25. The apparatus of claim 23 wherein the lubricating substance comprises fluid at least a portion of which is disposed in the first cavities.

26. The apparatus of claim 23 wherein each cavity in the set is filled with the lubricating substance.

27. The apparatus of claim 23 wherein the set comprises more than one cavities.

28. The apparatus of claim 23 wherein the contact surface overlies a substrate comprising a surface comprising a plurality of second cavities underlying, and in alignment with, the plurality of first cavities, wherein for each second cavity in alignment with a cavity in the set, the second cavity has a greater width dimension at a third depth than at a fourth depth shallower than the third depth.

29. An apparatus comprising:
an electrical connector comprising an electrically conductive contact surface and configured for insertion operations each of which results in electrical connection with a corresponding device through the contact surface and a lubricating substance located on the contact surface and movable on the contact surface, the lubricating substance providing boundary lubrication for the device;
the electrically conductive contact surface comprising a plurality of first cavities for trapping at least a portion of the lubricating substance;
the electrical connector further comprising a connector substrate layer underlying the contact surface and comprising a surface with a plurality of second cavities in alignment with the first cavities, wherein the plurality of second cavities comprises a set of one or more cavities each of which has a greater width dimension at a first depth than at a second depth shallower than the first depth;
wherein each first cavity in alignment with a cavity in the set has a center portion filled with the lubricating substance.

30. An apparatus comprising:
an electrical connector comprising an electrically conductive contact surface and configured for insertion operations each of which results in electrical connection with a corresponding device through the contact surface and a lubricating substance located on the contact surface and movable on the contact surface, the lubricating substance providing boundary lubrication for the device;
the electrically conductive contact surface comprising a plurality of first cavities for trapping at least a portion of the lubricating substance;
the electrical connector further comprising a connector substrate layer underlying the contact surface and comprising a surface with a plurality of second cavities in alignment with the first cavities, wherein the plurality of second cavities comprises a set of one or more cavities each of which has a greater width dimension at a first depth than at a second depth shallower than the first depth;
wherein each first cavity in alignment with a cavity in the set is filled with the lubricating substance.

* * * * *